(12) United States Patent
Oka (10) Patent No.: US 12,027,349 B2
(45) Date of Patent: Jul. 2, 2024

(54) PLASMA PROCESSING APPARATUS

(71) Applicant: Tokyo Electron Limited, Tokyo (JP)

(72) Inventor: Shinsuke Oka, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 242 days.

(21) Appl. No.: 17/548,594

(22) Filed: Dec. 13, 2021

(65) Prior Publication Data

US 2022/0189748 A1 Jun. 16, 2022

(30) Foreign Application Priority Data

Dec. 14, 2020 (JP) .................. 2020-206801

(51) Int. Cl.
*H01J 37/32* (2006.01)

(52) U.S. Cl.
CPC .... *H01J 37/32724* (2013.01); *H01J 37/3244* (2013.01); *H01J 37/32816* (2013.01)

(58) Field of Classification Search
CPC ............. H01J 37/32724; H01J 37/3244; H01J 37/32816; H01J 37/32715; H01J 37/32798; H01J 37/32623; H01J 2237/334; H01J 37/32082; H01J 37/32009; H01J 37/32532; H01J 15/00; H01J 37/32091; C23C 16/509; C23C 16/5096; C23C 16/45565; C23C 16/507; H01L 21/67069
USPC ..... 118/723 E, 723 ER; 156/345.43, 345.44, 156/345.45, 345.46, 345.47
See application file for complete search history.

(56) References Cited

U.S. PATENT DOCUMENTS

| 5,177,878 | A | * | 1/1993 | Visser | ................ | C23C 16/466 34/239 |
| 2009/0230636 | A1 | * | 9/2009 | Goto | ................ | H01L 21/6831 279/128 |
| 2010/0177454 | A1 | * | 7/2010 | Elliot | ................ | H01L 21/67109 361/234 |

(Continued)

FOREIGN PATENT DOCUMENTS

| JP | 2000-195935 A | 7/2000 |
| JP | 2018-093173 A | 6/2018 |

(Continued)

OTHER PUBLICATIONS https://en.wikipedia.org/wiki/Polyether_ether_ketone.*

*Primary Examiner* — Rudy Zervigon
(74) *Attorney, Agent, or Firm* — XSENSUS LLP (57) ABSTRACT

A plasma processing apparatus is provided. The plasma processing apparatus comprises: a dielectric member having a placement surface on which an object to be processed is placed and a back surface opposite to the placement surface, and having a first through-hole penetrating through the placement surface and the back surface; a mounting table having a support surface for supporting the dielectric member and a base having a second through-hole communicating with the first through-hole; and an embedded member disposed in the first through-hole and the second through-hole, wherein the embedded member includes a first embedded member disposed in the first through-hole and a second embedded member disposed in the second through-hole, and the rigidity of the second embedded member is lower than the rigidity of the first embedded member.

20 Claims, 8 Drawing Sheets

(56) References Cited

U.S. PATENT DOCUMENTS

| | | | |
|---|---|---|---|
| 2017/0352568 A1* | 12/2017 | Cho | H01L 21/6831 |
| 2022/0246398 A1* | 8/2022 | Ishikawa | H01L 21/6875 |
| 2022/0415627 A1* | 12/2022 | Nishi | H01J 37/32449 |
| 2023/0055928 A1* | 2/2023 | Takebayashi | H01L 21/67248 |
| 2023/0150889 A1* | 5/2023 | Matsufuji | C04B 38/0074 |
| | | | 55/523 |

FOREIGN PATENT DOCUMENTS

| | | |
|---|---|---|
| JP | 2019-519927 A | 7/2019 |
| JP | 2019-149422 A | 9/2019 |
| JP | 2019-165194 A | 9/2019 |

* cited by examiner

PLASMA PROCESSING APPARATUS

CROSS-REFERENCE TO RELATED APPLICATION

This application claims priority to Japanese Patent Application No. 2020-206801 filed on Dec. 14, 2020, the entire contents of which are incorporated herein by reference.

TECHNICAL FIELD

The present disclosure relates to a plasma processing apparatus.

BACKGROUND

Conventionally, a plasma processing apparatus for performing etching or the like on an object to be processed, such as a wafer or the like, using plasma has been known (see, e.g., Japanese Patent Application Publication No. 2000-195935). This plasma processing apparatus includes, e.g., a mounting table that serves as an electrode and holds the object to be processed in a processing chamber capable of forming a vacuum space. The mounting table has a through-hole for supplying a heat transfer gas to a space between the backside of the object to be processed placed on the mounting table and the upper surface of the mounting table.

SUMMARY

Recently, in the plasma processing apparatus, a radio frequency (RF) power applied to the mounting table has a high voltage to perform plasma processing. When the RF power applied to the mounting table has a high voltage, the energy of the RF power is concentrated in the through-hole for supplying the heat transfer gas, which may result in abnormal discharge. When abnormal discharge occurs in the through-hole for supplying the heat transfer gas, the quality of the object to be processed by the plasma processing apparatus may deteriorate, which may cause a decrease in yield.

In one aspect, the present disclosure provides a plasma processing apparatus having an embedded member for preventing abnormal discharge in a through-hole for a heat transfer gas.

To this end, a plasma processing apparatus is provided. The plasma processing apparatus comprises: a dielectric member having a placement surface on which an object to be processed is placed and a back surface opposite to the placement surface, and having a first through-hole penetrating through the placement surface and the back surface; a mounting table having a support surface for supporting the dielectric member and a base having a second through-hole communicating with the first through-hole; and an embedded member disposed in the first through-hole and the second through-hole, wherein the embedded member includes a first embedded member disposed in the first through-hole and a second embedded member disposed in the second through-hole, and the rigidity of the second embedded member is lower than the rigidity of the first embedded member.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments for carrying out the present disclosure will be described in detail with reference to the accompanying drawings. Like reference numerals will be given to substantially like parts throughout this specification and the drawings, and redundant description thereof will be omitted.

(Configuration of Plasma Processing Apparatus)

Figure 1:
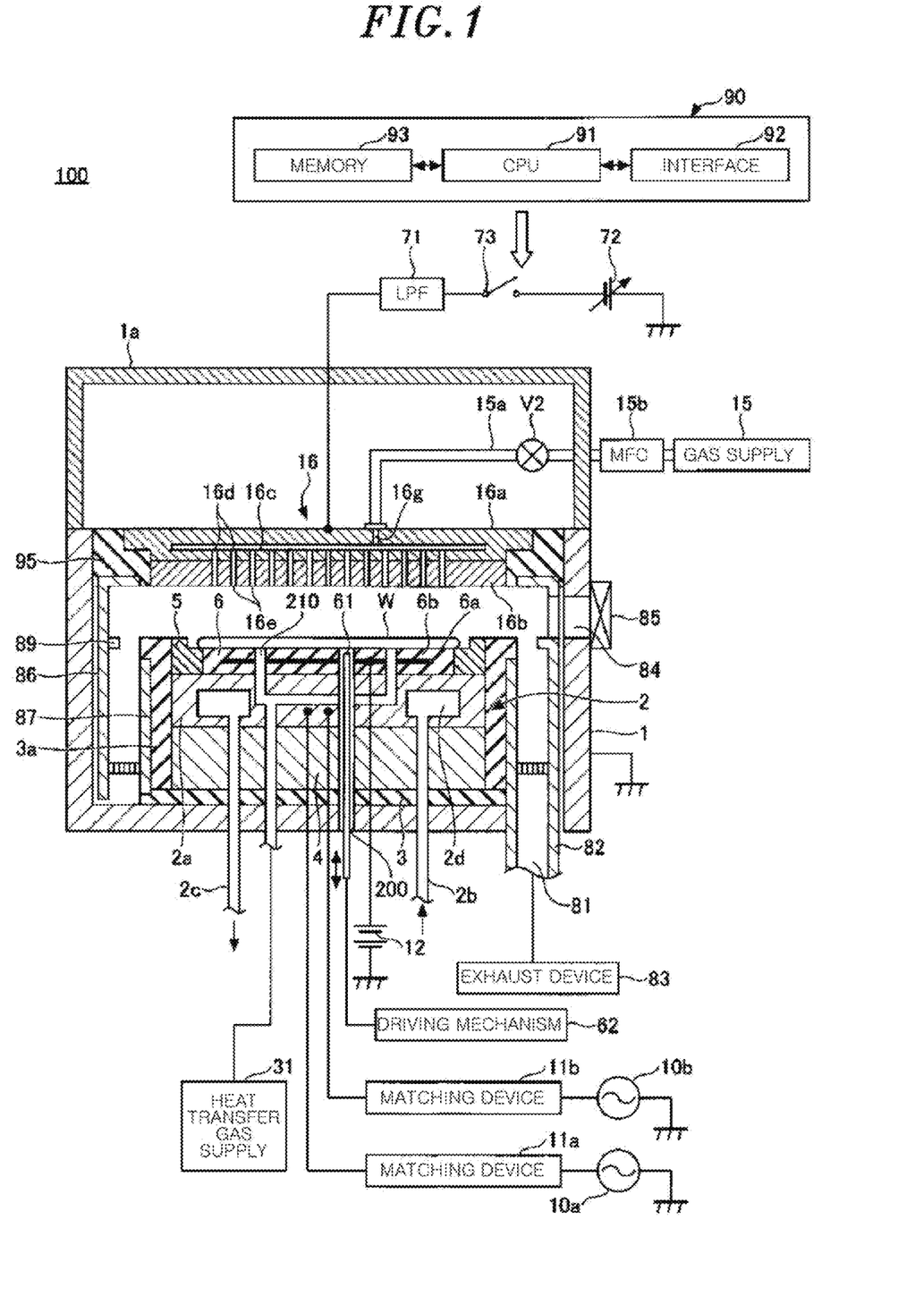
FIG. 1 is a schematic cross-sectional view of an example of a configuration of a plasma processing apparatus according to a first embodiment.

FIG. 1 is a schematic cross-sectional view showing an example of a configuration of a plasma processing apparatus 100 according to a first embodiment. A plasma processing apparatus 100 includes an airtight processing chamber 1 that is electrically grounded. The processing chamber 1 has a cylindrical shape and is made of, e.g., aluminum or the like. The processing chamber 1 defines a processing space where plasma is generated. A mounting table 2 for horizontally supporting a semiconductor wafer (hereinafter, simply referred to as "wafer") W, which is a work-piece, is disposed in the processing chamber 1. The mounting table 2 includes a base 2a and an electrostatic chuck (ESC) 6. The base 2a is made of a conductive metal, such as aluminum or the like, and serves as a lower electrode. The electrostatic chuck 6 is made of ceramic, e.g., alumina or the like, and has a function of electrostatically attracting the wafer W. The mounting table 2 is supported by a support 4. The support 4 is supported by a support member 3 made of, e.g., quartz or the like. Further, an edge ring 5 made of, e.g., silicon, is disposed on an upper outer peripheral portion of the mounting table 2. Further, in the processing chamber 1, a cylindrical inner wall member 3a made of, e.g., quartz or the like, is disposed to surround the mounting table 2 and the support 4.

A first RF power supply 10a is connected to the base 2a via a matching device 11a, and a second RF power supply 10b is connected to the base 2a via a matching device 11b. The first RF power supply 10a supplies an RF power for plasma generation having a predetermined frequency to the base 2a of the mounting table 2. Further, the second RF power supply 10b supplies an RF power for ion attraction (for bias) having a predetermined frequency lower than the frequency of the RF power from the first RF power supply 10a to the base 2a of the mounting table 2.

A shower head 16 serving as an upper electrode is disposed above the mounting table 2, facing and running parallel to the mounting table 2. The shower head 16 and the mounting table 2 function as a pair of electrodes (the upper electrode and the lower electrode).

The electrostatic chuck 6 has a structure in which an electrode 6a is embedded in an insulator 6b, and a DC power supply 12 is connected to the electrode 6a. When a DC voltage is applied to the electrode 6a from the DC power supply 12, the wafer W is attracted and held by a Coulomb force.

A coolant channel 2d is formed in the mounting table 2, and a coolant inlet line 2b and a coolant outlet line 2c are connected to the coolant channel 2d. The mounting table 2 is controlled to a predetermined temperature by circulating an appropriate coolant, such as cooling water or the like, in the coolant channel 2d. Further, a gas supply line 210 for supplying a cold heat transfer gas (hereinafter, also referred to as "heat transfer gas"), such as helium gas or the like, to the backside of the wafer W penetrates through the mounting table 2 or the like. The gas supply line 210 is connected to a heat transfer gas supply 31. With this configuration, the wafer W on the mounting table 2 is controlled to a predetermined temperature. An internal structure of the gas supply line 210 will be described later.

The mounting table 2 is provided with a plurality of, e.g., three, pin through-holes 200 (only one is shown in FIG. 1), and lifter pins 61 are respectively inserted into the pin through-holes 200. The lifter pins 61 are connected to a driving mechanism 62 and moved up and down by the driving mechanism 62.

The shower head 16 is disposed at a ceiling wall of the processing chamber 1. The shower head 16 includes a main body 16a and an upper ceiling plate 16b forming an electrode plate, and is supported at an upper portion of the processing chamber 1 via an insulating member 95. The main body 16a is made of a conductive material, e.g., aluminum having an anodically oxidized surface. The upper ceiling plate 16b is detachably supported below the main body 16a.

The main body 16a has a gas diffusion space 16c therein. A large number of gas flowing holes 16d are formed in a bottom portion of the main body 16a, to be located lower than the gas diffusion space 16c. Gas injection holes 16e penetrate through the upper ceiling plate 16b in a thickness direction and communicate with the gas flowing holes 16d.

A gas inlet port 16g for introducing a processing gas into the gas diffusion space 16c is formed at the main body 16a. One end of the gas supply line 15a is connected to the gas inlet port 16g. A gas supply 15 for supplying a processing gas is connected to the other end of the gas supply line 15a. A mass flow controller (MFC) 15b and an on-off valve V2 are disposed in the gas supply line 15a in that order from an upstream side. The processing gas for plasma etching is supplied from the gas supply 15 to the gas diffusion space 16c through the gas supply line 15a. With this configuration, the processing gas supplied to the gas diffusion space 16c is diffused and supplied in a shower-like manner into the processing chamber 1 through the gas flowing holes 16d and the gas injection holes 16e.

A variable DC power supply 72 is electrically connected to the shower head 16 serving as the upper electrode through a low pass filter (LPF) 71. On/off of power supply from the variable DC power supply 72 can be controlled by an on/off switch 73. A current and a voltage of the variable DC power supply 72 and an on/off operation of the on/off switch 73 are controlled by a controller 90. When plasma is generated in the processing space by applying the RF power from the first RF power supply 10a and the second RF power supply 10b to the mounting table 2, the on/off switch 73 is turned on by the controller 90 and a predetermined DC voltage is applied to the shower head 16, if necessary.

A cylindrical ground conductor 1a extends upward from a sidewall of the processing chamber 1, to be located higher than the shower head 16. The cylindrical ground conductor 1a has a ceiling wall at the top thereof.

An exhaust port 81 is formed at a bottom portion of the processing chamber 1. An exhaust device 83 is connected to the exhaust port 81 through an exhaust line 82. The exhaust device 83 has a vacuum pump. By operating the vacuum pump, the pressure in the processing chamber 1 is decreased to a predetermined vacuum level. A loading/unloading port 84 for the wafer W is disposed at a sidewall of the processing chamber 1, and a gate valve 85 for opening/closing the loading/unloading port 84 is disposed at the loading/unloading port 84.

A deposition shield 86 is disposed along an inner wall surface at an innder side of the processing chamber 1. The deposition shield 86 prevents etching by-products (deposits) from being attached to the processing chamber 1. A conductive member (GND block) 89 is disposed at a portion of the deposition shield 86 at a height position substantially the same as the height of the wafer W. The conductive member 89 is connected to the ground such that a potential for the ground can be controlled. Accordingly, abnormal discharge is prevented. Further, a deposition shield 87 extending along the inner wall member 3a is disposed at a lower end portion of the deposition shield 86. The deposition shields 86 and 87 are detachably provided.

The controller 90 controls an overall operation of the plasma processing apparatus 100 configured as described. The controller 90 includes a CPU 91 for controlling individual components of the plasma processing apparatus 100, an interface 92, and a memory 93.

The interface 92 includes a keyboard through which a process manager inputs commands to manage the plasma processing apparatus 100, a display for visualizing and displaying an operation status of the plasma processing apparatus 100, or the like.

The memory 93 stores therein recipes in which control programs (software), processing condition data, and the like for realizing various processes performed by the plasma processing apparatus 100 under the control of the CPU 91. If necessary, a certain recipe is retrieved from the memory 93 by a command corresponding to an input operation from the interface 92 and executed by the CPU 91. Accordingly, desired processing is performed in the plasma processing apparatus 100 under the control of the CPU 91. Further, the recipes such as the control programs, the processing condition data, and the like may be stored in a computer-readable computer storage medium (e.g., a hard disk, a CD, a flexible disk, a semiconductor memory, or the like), or may be transmitted, when needed, from another apparatus through, e.g., a dedicated line, and used online.

(Configuration of the Mounting Table of the First Embodiment)

Figure 2:
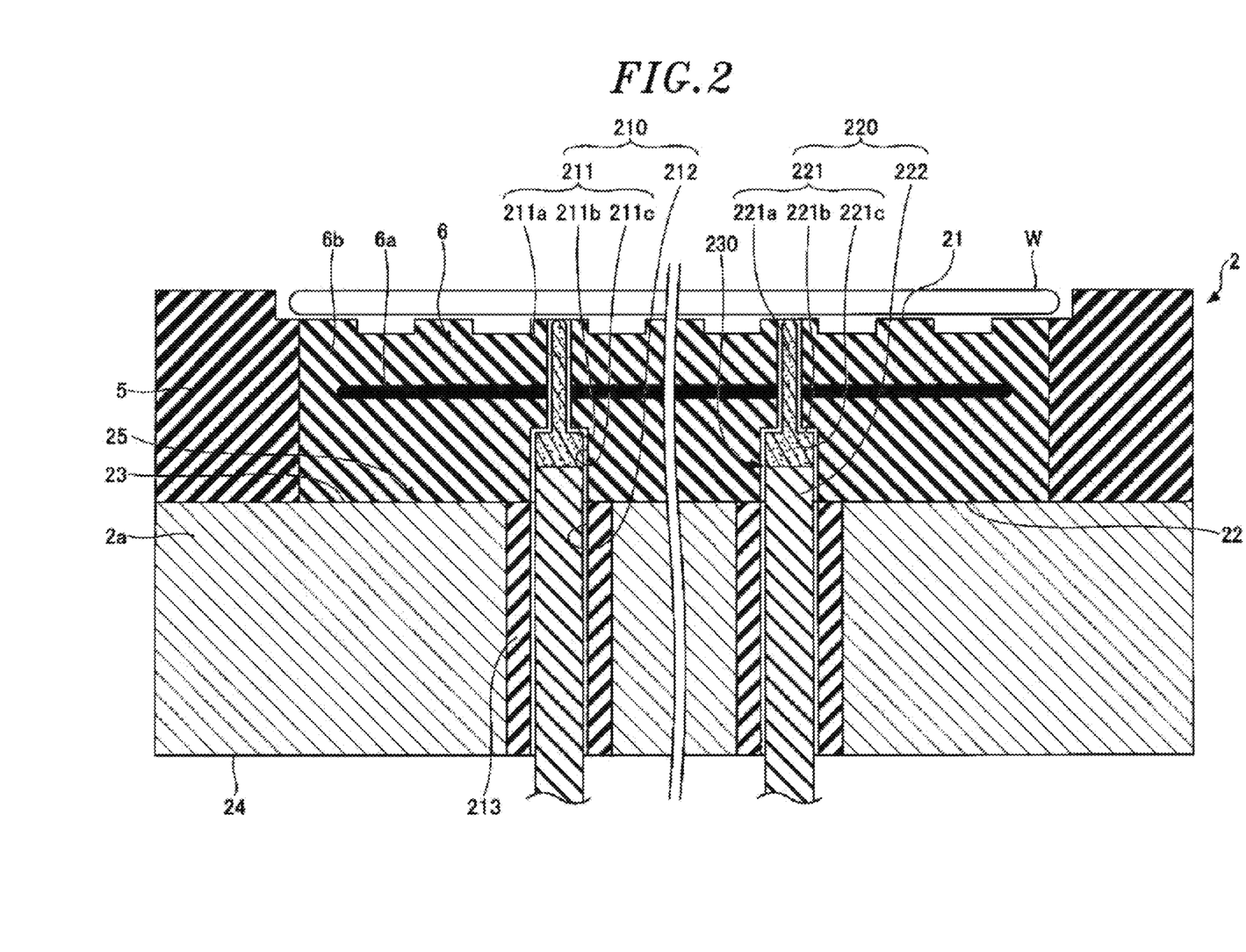
FIG. 2 shows an example of a schematic cross-sectional view of a mounting table according to the first embodiment.

An example of the configuration of the mounting table 2 according to the first embodiment will be described with reference to FIG. 2. FIG. 2 shows an example of a schematic cross-sectional view of the mounting table 2 according to the first embodiment. The mounting table 2 has a base 2a and an electrostatic chuck 6. As described above, the base 2a is made of a conductive metal (e.g., aluminum). The electrostatic chuck 6 is made of a plasma-resistant ceramic (e.g., alumina). In other words, the base 2a and the electrostatic chuck 6 are made of different materials. An edge ring 5 made of, e.g., silicon, is disposed on an upper outer peripheral portion of the mounting table 2.

The electrostatic chuck 6 is formed in a disc shape, and has a placement surface 21 on which the disc-shaped wafer W is placed and a back surface 22 facing the placement surface 21. The base 2a has a support surface 23 that supports the electrostatic chuck 6 and a back surface 24 opposite to the support surface 23. The back surface 22 of the electrostatic chuck 6 and the support surface 23 of the base 2a are joined to form an interface 25.

An end portion (gas hole) of the gas supply line 210 is formed at the placement surface 21. The gas supply line 210 forms through-holes 211 and 212, and supplies a heat transfer gas, such as helium gas or the like, to the backside of the wafer W. The through-hole 211 extends from the back surface 22 of the electrostatic chuck 6 to the placement surface 21. In other words, the inner wall of the through-hole 211 is defined by the electrostatic chuck 6. On the other hand, the through-hole 212 extends from the back surface 24 of the base 2a to the support surface 23. In other words, the inner wall of the through-hole 212 is defined by the base 2a (inner peripheral surface of a gas sleeve 213 to be described later).

The through-hole 211 is an example of a first through-hole penetrating through the placement surface 21 on which the wafer W is placed and the back surface 22 opposite to the placement surface 21. The through-hole 212 is an example of a second through-hole formed in the base 2a and communicating with the first through-hole. Further, the electrostatic chuck is an example of a dielectric member having the first through-hole. However, the dielectric member having the first through-hole formed therein does not need to have a function of the electrostatic chuck 6.

The through-hole 211 has a small diameter portion 211a, a stepped portion 211b, and a large diameter portion 211c. The small diameter portion 211a is a hole with one end (upper end) thereof open toward the placement surface 21. The large diameter portion 211c is a hole with one end (lower end) thereof open toward the back surface 22. The hole diameter of the small diameter portion 211a is smaller than that of the large diameter portion 211c. The other end (lower end) of the small diameter portion 211a is connected to and communicates with the other end (upper end) of the large diameter portion 211c. Further, the stepped portion 211b is formed at a connecting portion between the small diameter portion 211a and the large diameter portion 211c having different hole diameters.

A hole diameter of the through-hole 212 is the same as that of the large diameter portion 211c (below the stepped portion 211b of the through-hole 211). The through-holes 211 and 212 are formed to be aligned at the same position at room temperature, for example. The gas sleeve 213 made of alumina is disposed around the gas supply line 210. A spacer may be disposed on the inner wall of the gas supply line 210.

An embedded member 220 is disposed in the gas supply line 210. The embedded member 220 has a first embedded member 221 disposed in the through-hole 211 and a second embedded member 222 disposed at least in the through-hole 212.

The first embedded member 221 is formed in a convex shape in cross-sectional view. In other words, the first embedded member 221 has a small diameter portion 221a, a stepped portion 221b, and a large diameter portion 221c. The diameter of the small diameter portion 221a is smaller than that of the large diameter portion 221c. Further, the stepped portion 221b is formed at a connecting portion between the small diameter portion 221a and the large diameter portion 221c having different diameters.

Further, the diameter of the small diameter portion 221a of the first embedded member 221 is smaller than that of the small diameter portion 211a of the through-hole 211. Further, the diameter of the large diameter portion 221c of the first embedded member 221 is greater than the hole diameter of the small diameter portion 211a of the through-hole 211 and smaller than the hole diameter of the large diameter portion 211c of the through-hole 211. Accordingly, the first embedded member 221 inserted into the through-hole 211 from the back surface 22 side of the electrostatic chuck 6 cannot be pulled out toward the placement surface 21 of the electrostatic chuck 6.

The first embedded member 221 is made of a plasma-resistant material, such as ceramic or the like. For example, the first embedded member 221 may be made of any one of quartz, silicon carbide, silicon nitride, aluminum oxide, aluminum nitride, yttrium oxide, titanium oxide, and tungsten carbide.

The second embedded member 222 is disposed below the first embedded member 221. The second embedded member 222 is formed as a shaft member. The shaft diameter of the second embedded member 222 is the same as the hole diameter of the large diameter portion 221c of the first embedded member 221. Further, the shaft diameter of the second embedded member 222 is smaller than the hole diameters of the large diameter portion 211c of the through-hole 211 and the through-hole 212.

The second embedded member 222 is made of a material (elastic material) having a rigidity lower than that of the first embedded member 221. For example, it is made of fluororesin such as polytetrafluoroethylene (PTFE).

Further, the axial length of the first embedded member 221 is shorter than the thickness of the electrostatic chuck 6 (axial length of the through-hole 211). Specifically, the axial length of the small diameter portion 221a of the first embedded member 221 is substantially equal to that of the small diameter portion 211a of the through-hole 211. The axial length of the large diameter portion 221c of the first embedded member 221 is shorter than that of the large diameter portion 211c of the through-hole 211.

The second embedded member 222 is disposed over the through-hole 212 and the large diameter portion 211c of the through-hole 211. That is, the interface 230 where the first embedded member 221 and the second embedded member 222 are in contact with each other is disposed in the through-hole 211. In other words, the second embedded member 222 is disposed at a height position of the interface 25 between the back surface 22 of the electrostatic chuck 6 and the support surface 23 of the base 2a.

The diameter of the first embedded member 221 is smaller than the hole diameter of the through-hole 211. The diameter of the second embedded member 222 is smaller than the hole diameter of the through-hole 212. Accordingly, the first embedded member 221 and the second embedded member 222 are apaced apart from the inner wall of the gas supply line 210 by a predetermined distance, and a heat transfer gas path is formed in the through-holes 211 and 212.

In the plasma processing apparatus 100, the RF power applied to the mounting table 2 has a high voltage. When the RF power applied to the mounting table 2 has a high voltage, abnormal discharge may occur near the through-hole 211.

In other words, in the plasma processing apparatus 100, when the RF power is applied to the mounting table 2, a potential difference is generated between the wafer W and the back surface 22 of the electrostatic chuck 6 due to the electrostatic capacitance of the electrostatic chuck 6. Accordingly, when the RF potential difference generated in the through-hole 211 exceeds a limit value at which discharge occurs, abnormal discharge occurs.

On the other hand, it is known that the occurrence of abnormal discharge is prevented by shortening the minimum straight distance of charged particles of the heat transfer gas in the through-hole 211 based on Paschen's law. Therefore, in the present embodiment, the embedded member 220 is disposed in the gas supply line 210 to prevent the occurrence of abnormal discharge.

Here, the mounting table 2 according to the first embodiment will be further described in comparison with the mounting table 2 according to a reference example.

Figure 3:
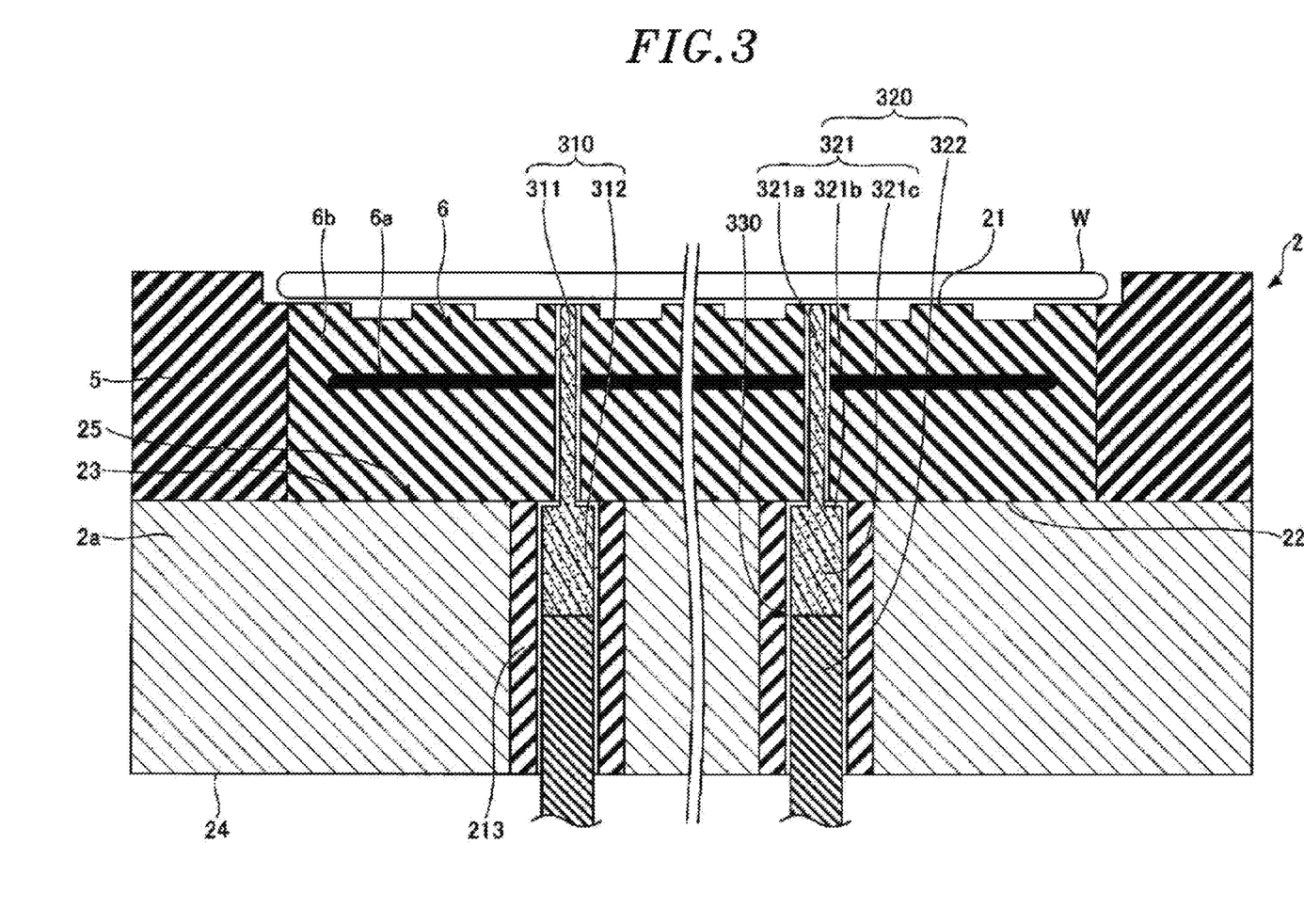
FIG. 3 shows an example of a schematic cross-sectional view of a mounting table of a reference example.
Figure 4:
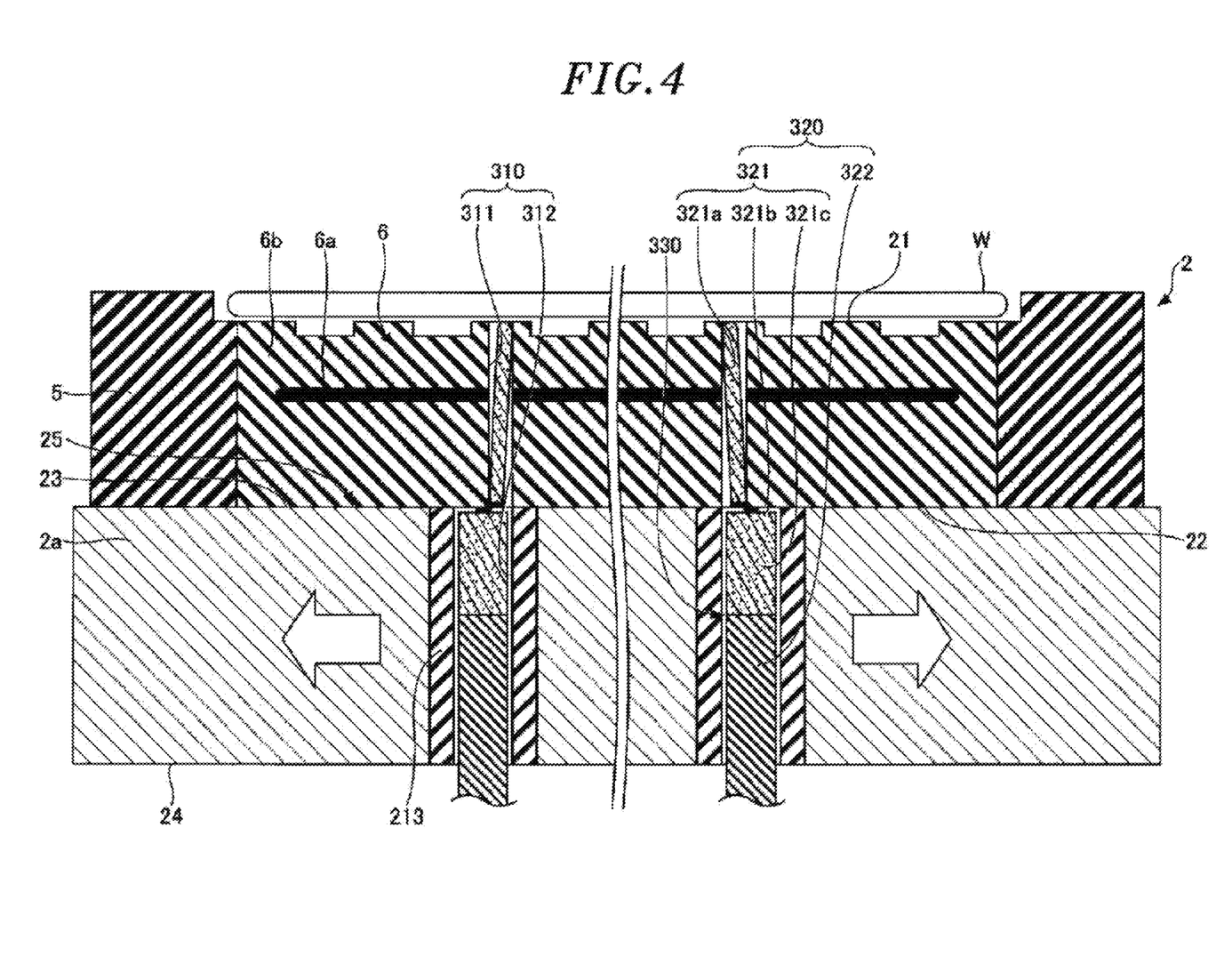
FIG. 4 shows an example of a schematic cross-sectional view of the mounting table of the reference example at the time of thermal expansion.

The mounting table 2 having an embedded member 320 according to the reference example will be described with reference to FIGS. 3 and 4. FIG. 3 shows an example of a schematic cross-sectional view of the mounting table 2 according to the reference example. FIG. 4 shows an example of a schematic cross-sectional view of the mounting table 2 of the reference example at the time of thermal expansion.

In the mounting table 2 of the reference example, a gas supply line 310 is formed instead of the gas supply line 210 (see FIG. 2). The gas supply line 310 forms through-holes 311 and 312. The through-hole 311 extends from the back surface 22 of the electrostatic chuck 6 to the placement surface 21. The through-hole 312 extends from the back surface 24 of the base 2a to the support surface 23. The hole diameter of the through-hole 311 is smaller than that of the through-hole 312.

Further, the embedded member 320 is disposed in the gas supply line 310. The embedded member 320 has a first embedded member 321 and a second embedded member 322.

The first embedded member 321 is formed in a convex shape in cross-sectional view. In other words, the first embedded member 321 has a small diameter portion 321a, a stepped portion 321b, and a large diameter portion 321c. The diameter of the small diameter portion 321a is smaller than that of the large diameter portion 321c. Further, the stepped portion 321b is formed at a connecting portion between the small diameter portion 321a and the large diameter portion 321c having different diameters.

Further, the diameter of the small diameter portion 321a of the first embedded member 321 is smaller than the hole diameter of the through-hole 311. Further, the diameter of the large diameter portion 321c of the first embedded member 321 is greater than the hole diameter of the through-hole 311 and smaller than the hole diameter of the through-hole 312. Accordingly, the first embedded member 321 inserted into the gas supply line 310 (the through-holes 311 and 312) from the back surface 24 side of the base 2a cannot be pulled out toward the placement surface 21 of the electrostatic chuck 6.

The first embedded member 321 is made of a plasma resistant material, such as ceramic or the like.

The second embedded member 322 is disposed below the first embedded member 321. The second embedded member 322 is formed as a shaft member. The shaft diameter of the second embedded member 322 is the same as the hole diameter of the large diameter portion 321c of the first embedded member 321. Further, the shaft diameter of the second embedded member 322 is smaller than the hole diameter of the through-hole 312.

The second embedded member 322 is made of, e.g., alumina.

The small diameter portion 321a of the first embedded member 321 is disposed at the interface 25 between the back surface 22 of the electrostatic chuck 6 and the support surface 23 of the base 2a. Further, the interface 330 where the first embedded member 321 and the second embedded member 322 are in contact with each other is disposed in the through-hole 312.

The embedded member 320 according to the reference example is spaced apart from the inner wall of the gas supply line 310 by a predetermined distance.

The occurrence of abnormal discharge in the through-hole 311 can be prevented by reducing the distance between the embedded member 320 and the through-hole 311. The occurrence of abnormal discharge in the through-hole 311 can also be prevented by shortening a linear portion of the heat transfer gas path. This is because electrons in the heat transfer gas can reduce the energy. Therefore, as shown in FIG. 3, the diameter of the through-hole 312 may be formed to be greater than the diameter of the through-hole 311 and the portion of the embedded member 320 corresponding to the through-hole 312 may be formed to be thicker than the portion corresponding to the through-hole 311.

However, in this case, the embedded member 320 may be damaged. For example, the mounting table 2 reaches a high temperature of, e.g., 100° C. to 200° C., when plasma processing is performed. The electrostatic chuck 6 is made of ceramic, and the base 2a is made of metal. The electrostatic chuck 6 and the base 2a have different linear thermal expansion coefficients. Therefore, when the temperatures of the electrostatic chuck 6 and the base 2a become high, the through-holes 311 and 312 would be misaligned as shown in FIG. 4 due to a difference in the thermal expansion between the electrostatic chuck 6 and the base 2a. In this case, shear stress is applied from the base 2a to the embedded member 320. Accordingly, the portion of the embedded member 320 corresponding to the through-hole 311 is brought into contact with the electrostatic chuck 6, which may result in damage of the embedded member 320.

Figure 5:
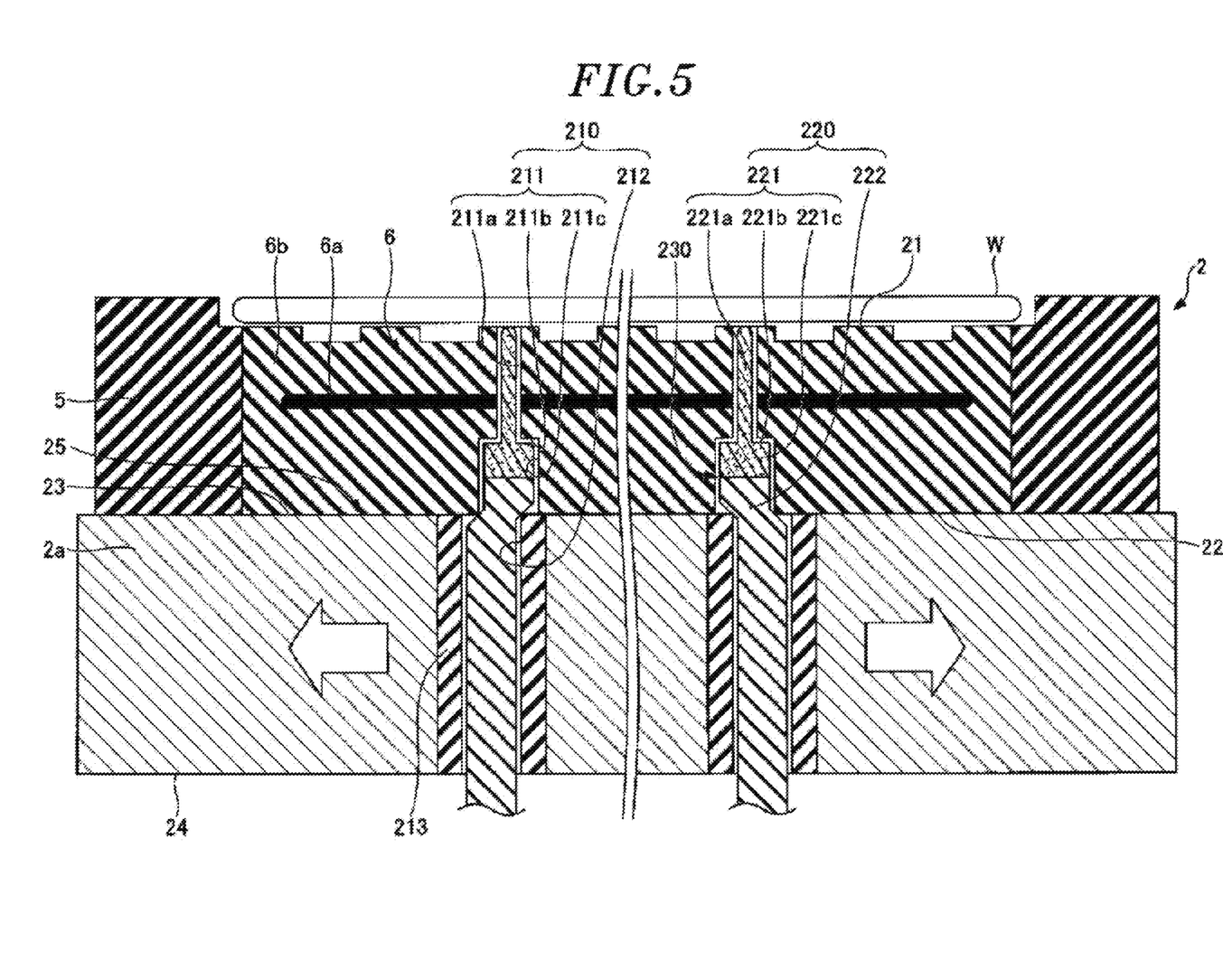
FIG. 5 shows an example of a schematic cross-sectional view of the mounting table according to the first embodiment at the time of thermal expansion.

The mounting table 2 of the first embodiment at the time of thermal expansion will be described with reference to FIGS. 2 and 5. FIG. 5 shows an example of a schematic cross-sectional view of the mounting table 2 according to the first embodiment at the time of thermal expansion.

As shown in FIGS. 2 and 5, in the embedded member 220 according to the first embodiment, the second embedded member 222 having a rigidity lower than that of the first embedded member 221 is disposed below the first embedded member 221 which is plasma-resistant. Further, the first embedded member 221 and the second embedded member 222 are in contact with each other in the electrostatic chuck 6 (in the through-hole 211). In other words, the interface 230 between the first embedded member 221 and the second embedded member 222 is located higher (at the placement surface 21 side of the electrostatic chuck 6) than the interface 25 between the electrostatic chuck 6 and the base 2a.

With this configuration, as illustrated in one example of FIG. 5, when the through-holes 211 and 212 are misaligned due to thermal expansion, shear stress is applied from the base 2a to the embedded member 220. In this case, in the mounting table 2 according to the first embodiment, the second embedded member 222 having a low rigidity is deformed by the shear stress, thereby preventing the embedded member 220 from being damaged.

Further, since the embedded member 220 is disposed in the gas supply line 210, it is possible to sufficiently supply the heat transfer gas to the backside of the wafer W, and also possible to prevent occurrence of abnormal discharge in the through-hole 211 due to the RF power applied to the base 2a.

In addition, when the inside of the processing chamber 1 is evacuated by the exhaust device 83 shown in FIG. 1, the inside of the gas supply line 210 where the embedded member 220 is disposed is also evacuated to the processing space side. At that time, if the wafer W is not placed on the electrostatic chuck 6, the first embedded member 221 may protrude toward the processing space above the electrostatic chuck 6 through the through-hole 211 because the first embedded member 221 is not fixed to the second embedded member 222.

Therefore, the first embedded member 221 according to the first embodiment has the stepped portion 221b, and has a shape in which the diameter below the stepped portion 221b is larger than the diameter above the stepped portion 221b. Accordingly, it is possible to prevent the first embedded member 221 from protruding into the processing space when the inside of the processing chamber 1 is evacuated or when the heat transfer gas is supplied to the backside of the wafer W.

Further, the first embedded member 221 does not necessarily have a convex shape, and may have any shape in which the width of a lower portion is larger than that of an upper portion, as described above. Due to this shape, the first embedded member 221 can be prevented from protruding from the gas supply line 210.

(Another Configuration of the Mounting Table According to the First Embodiment)

Figure 6:
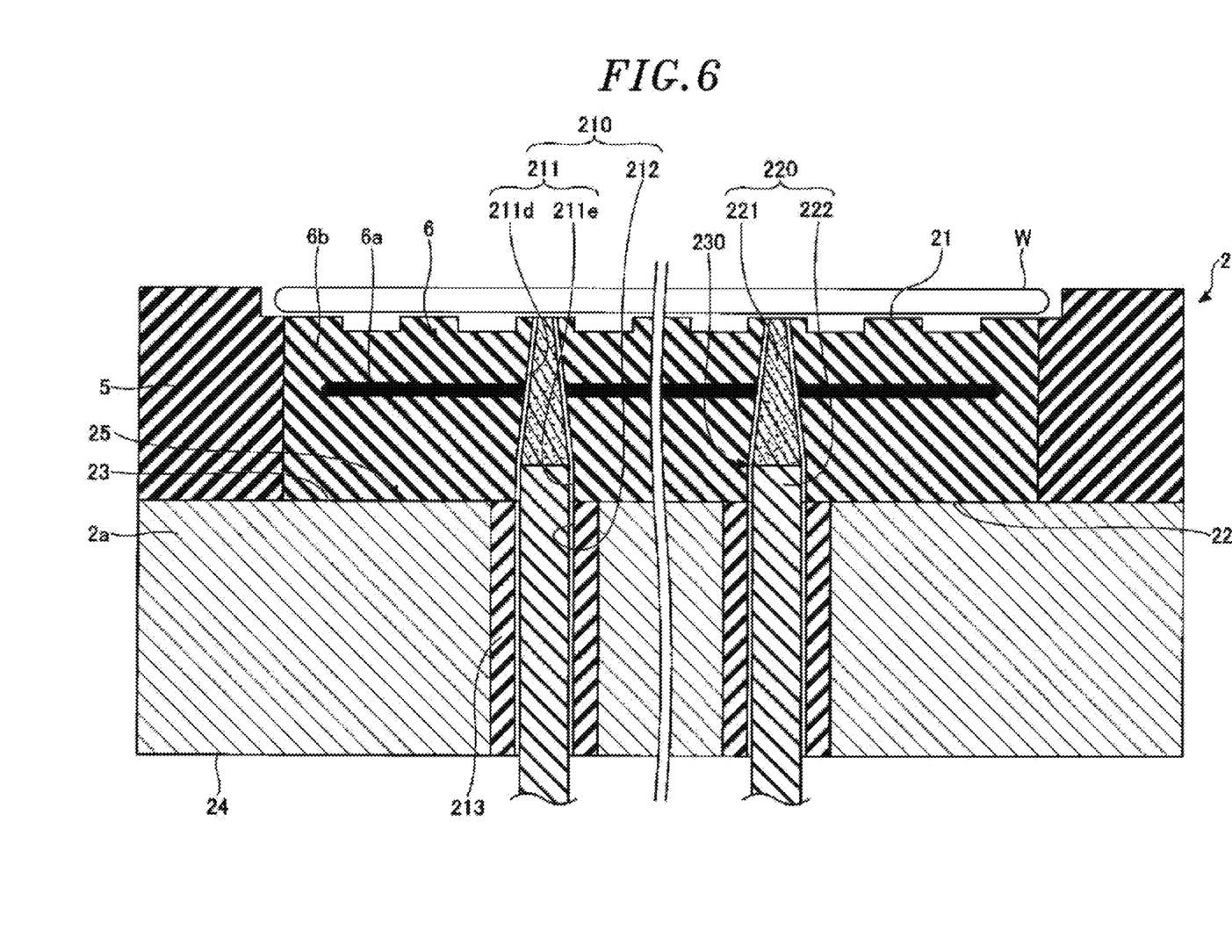
FIG. 6 shows another example of the schematic cross-sectional view of the mounting table according to the first embodiment.

Another example of the configuration of the mounting table 2 according to the first embodiment will be described with reference to FIG. 6. FIG. 6 shows another example of a schematic cross-sectional view of the mounting table 2 according to the first embodiment.

The gas supply line 210 forms the through-holes 211 and 212. The through-hole 211 extends from the back surface 22 of the electrostatic chuck 6 to the placement surface 21. The through-hole 211 has a truncated cone-shaped portion 211d and a cylindrical portion 211e. The truncated cone-shaped portion 211d is a hole having one end (upper end) that opens toward the placement surface 21. The cylindrical portion 211e is a hole having one end (lower end) that opens toward the back surface 22. The diameter of the truncated cone-shaped portion 211d increases from one end (upper end) toward the other end (lower end). The other end (lower end) of the truncated cone-shaped portion 211d is connected to and communicates with the other end (upper end) of the cylindrical portion 211e. Since the through-hole 312 is the same as the through-hole 312 shown in FIG. 2, redundant description will be omitted.

Further, the embedded member 220 is disposed in the gas supply line 210. The embedded member 220 includes the first embedded member 221 and the second embedded member 222. The first embedded member 221 is formed in a trapezoidal truncated cone shape (substantially triangular shape with a flat top) in cross sectional view. The first embedded member 221 is formed such that the diameter thereof increases from the upper surface toward the bottom surface. The first embedded member 321 is made of a plasma-resistant material, such as ceramic or the like. Since the second embedded member 222 is the same as the second embedded member 222 shown in FIG. 2, redundant description will be omitted.

The shape of the first embedded member 221 is not limited to those shown in FIGS. 2 and 6. The first embedded member 221 may have any shape as long as the width of the lower portion is greater than that of the upper portion.

(Configuration of the Mounting Table According to the Second Embodiment)

Figure 7:
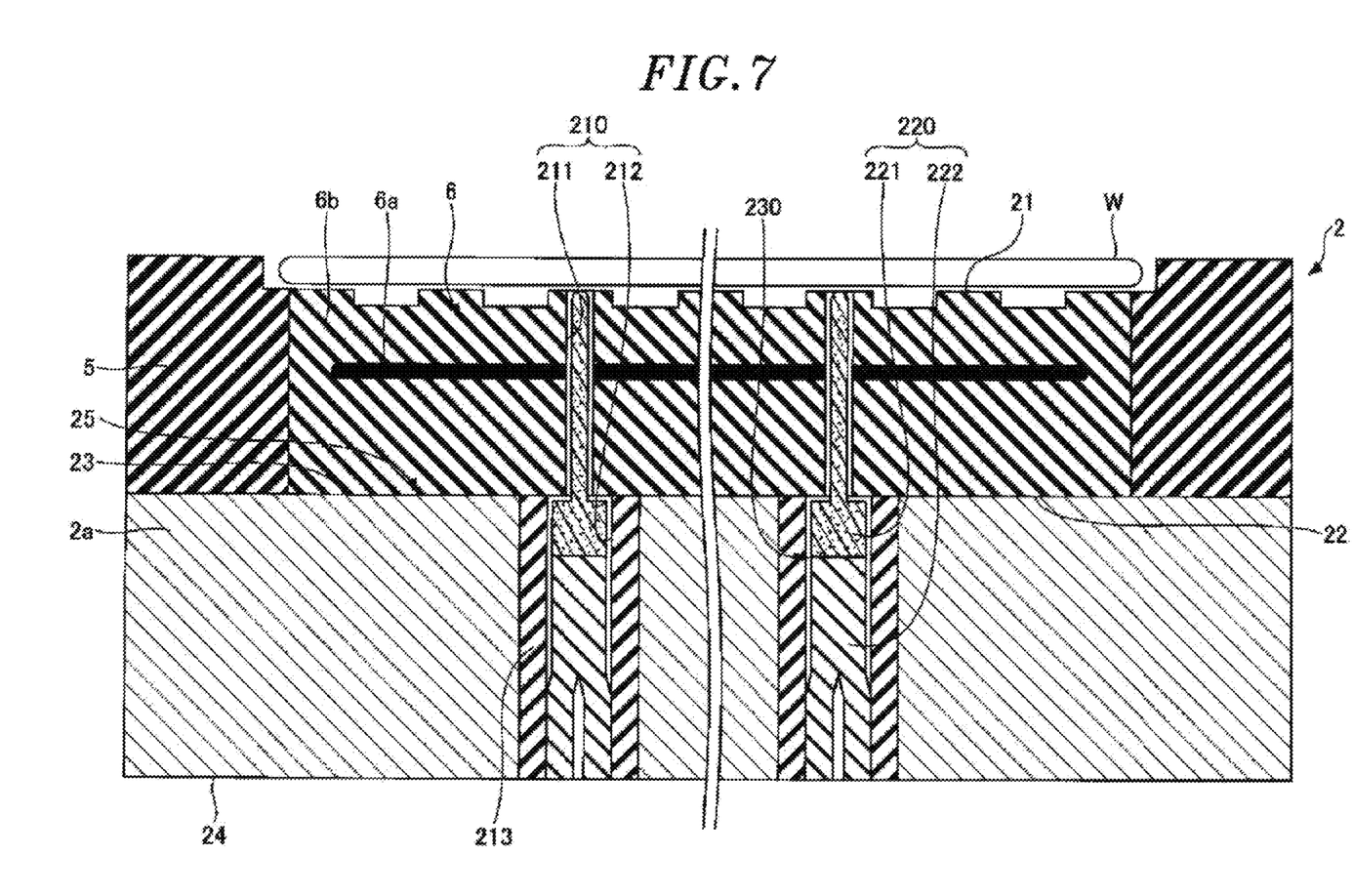
FIG. 7 shows an example of a schematic cross-sectional view of a mounting table according to a second embodiment.
Figure 8:
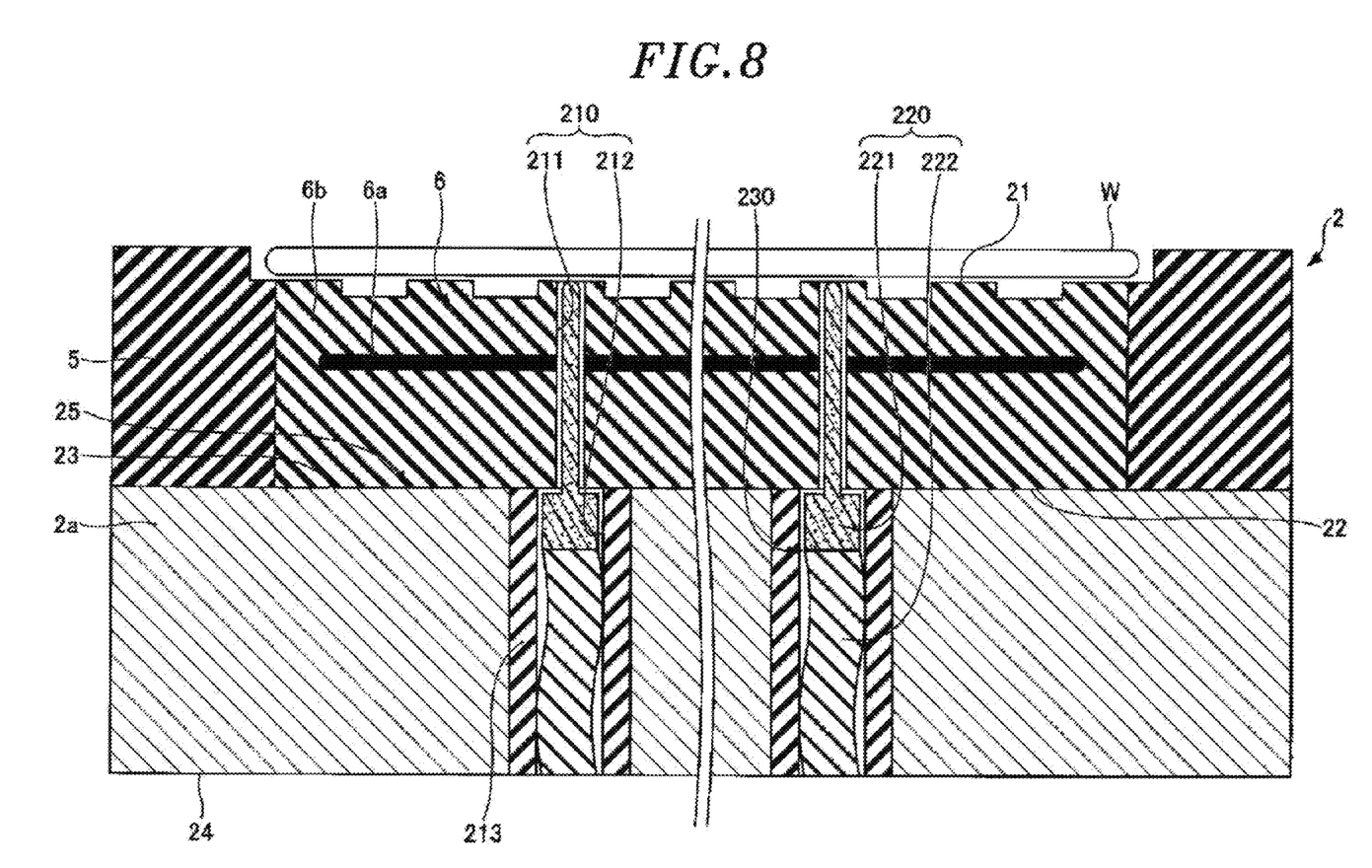
FIG. 8 shows another example of the schematic cross-sectional view of the mounting table according to the second embodiment.

Next, an example of a configuration of the mounting table 2 according to a second embodiment will be described with reference to FIGS. 7 and 8. FIG. 7 shows an example of a schematic cross-sectional view of the mounting table 2 according to the second embodiment. FIG. 8 shows another example of the schematic cross-sectional view of the mounting table 2 according to the second embodiment.

The mounting table 2 according to the second embodiment includes the base 2a and the electrostatic chuck 6 similarly to the mounting table 2 according to the first embodiment (see FIG. 2). Further, the gas supply line 210 forms the through-holes 211 and 212. The through-hole 211 extends from the back surface 22 of the electrostatic chuck 6 to the placement surface 21. The through-hole 212 extends from the back surface 24 of the base 2a to the support surface 23. Further, the embedded member 220 is disposed in the gas supply line 210. The embedded member 220 includes the first embedded member 221 and the second embedded member 222. The first embedded member 221 is made of a plasma-resistant material, such as ceramic or the like. The second embedded member 222 is made of a material (elastic material) having a rigidity lower than that of the first embedded member 221. Further, the first embedded member 221 has a shape in which the width of the lower portion is greater than that of the upper portion. Accordingly, the first embedded member 221 is prevented from protruding from the gas supply line 210 by the flow of the heat transfer gas.

The embedded member 220 is inserted into the through-holes 211 and 212 from the back surface 24 side of the base 2a. Here, the outer diameter of the embedded member 220 is designed to be slightly smaller than the inner diameter of the through-holes 211 and 212 so that the embedded member 220 can be smoothly inserted into the through-holes 211 and 212. However, if the inner diameters of the through-holes 211 and 212 are large and the outer diameter of the embedded member 220 is small within a tolerance range, the embedded member 220 may fall from the mounting table. For example, when the mounting table 2 is attached to the apparatus in a state where the embedded member 220 is inserted into the through-holes 211 and 212, the embedded member 220 may fall and be damaged. On the other hand, in the case of suppressing the falling of the embedded member 220 by strictly controlling the tolerance, the cost may increase.

On the other hand, in the mounting table 2 according to the second embodiment, the second embedded member 222 has a structure that generates a slight force in a horizontal direction (radial direction) with respect to the through-hole 212. In other words, the second embedded member 222 is configured to be elastically deformed and inserted into the through-hole 212 and press the inner peripheral surface of the through-hole 212 by a restoring force of the second embedded member 222.

For example, in the mounting table 2 shown in FIG. 7, the second embedded member 222 has a notch at a lower portion thereof and is bifurcated to expand outward. When the embedded member 220 is inserted into the through-holes 211 and 212, a frictional force is generated due to the contact between the lower portion of the second embedded member 222 that expands outward and the inner peripheral surface of the through-hole 212. Accordingly, the embedded member 220 can be prevented from falling. Further, when the embedded member 220 is inserted into the through-holes 211 and 212, the embedded member 220 can be smoothly inserted into the through-holes 211 and 212 by reducing the frictional force by bringing the outer peripheral surface of the second embedded member 222 into partial contact with the inner peripheral surface of the through-hole 212 to reduce the frictional force. The lower portion of the second embedded member 222 may be branched into three or more parts.

Further, in the mounting table 2 shown in FIG. 8, the second embedded member 222 has a curved shape. When the embedded member 220 is inserted into the through-holes 211 and 212, a frictional force is generated by partial contact between the second embedded member 222 that expands outward and the inner peripheral surface of the through-hole 212. Accordingly, the embedded member 220 can be prevented from falling. Further, when the embedded member 220 is inserted into the through-holes 211 and 212, the embedded member 220 can be smoothly inserted into the through-holes 211 and 212 by reducing the frictional force by bringing the outer peripheral surface of the second embedded member 222 into partial contact with the inner peripheral surface of the through-hole 212.

The second embedded member 222 shown in FIG. 7 or 8 may be applied to the mounting table 2 (see FIGS. 2 and 6) according to the first embodiment.

Although the plasma processing apparatus and the method for manufacturing a mounting table according to the embodiments of the present disclosure have been described, the plasma processing apparatus and the method for manufacturing a mounting table of the present disclosure are not limited to those in the above-described embodiments, and various modifications and improvements can be made within the scope of the present disclosure. The above-described embodiments can be combined without contradicting processing contents thereof.

Although the case where the interface 230 between the first embedded member 221 and the second embedded member 222 is disposed in the electrostatic chuck 6 (above the interface 25 between the electrostatic chuck 6 and the base 2a) has been described, the present disclosure is not limited thereto. The interface 230 between the first embedded member 221 and the second embedded member 222 may be disposed below the interface 25 between the electrostatic chuck 6 and the base 2a. In this case, the shear stress generated from the base 2a by thermal expansion is applied to the large diameter portion 221c of the first embedded member 221. Accordingly, it is possible to prevent damage of the embedded member 220.

The substrate processing apparatus of the present disclosure can be applied to any type of apparatus using capacitively coupled plasma (CCP), inductively coupled plasma (ICP), a radial line slot antenna, electron cyclotron resonance (ECR) plasma, and helicon wave plasma (HWP).

In this specification, the wafer W has been described as an example of an object to be processed by the plasma processing apparatus. However, the object to be processed is not limited thereto, and may be various substrates used for a liquid crystal display (LCD) and a flat panel display (FPD), a CD substrate, a printed circuit board, or the like.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A plasma processing apparatus comprising:
   a dielectric member having a placement surface on which an object to be processed is placed and a back surface opposite to the placement surface, and having a first through-hole extending from the back surface to the placement surface;
   a mounting table having a support surface for supporting the dielectric member and a base having a second through-hole communicating with the first through-hole; and
   an embedded member disposed in the first through-hole and the second through-hole,
   wherein the embedded member includes a first embedded member disposed in the first through-hole and a second embedded member disposed in the second through-hole,
   wherein the rigidity of the second embedded member is lower than the rigidity of the first embedded member,
   wherein the first embedded member and the second embedded member are spaced apart from an inner wall of the dielectric member and an inner wall of the base by a predetermined distance, thereby forming a heat transfer gas path in the first and second through-holes, and
   wherein a portion of the second embedded member is disposed within the first through-hole.

2. The plasma processing apparatus of claim 1, wherein the first embedded member and the second embedded member are in contact with each other in the first through-hole.

3. The plasma processing apparatus of claim 1, wherein the first embedded member has a lower portion having a width larger than the width of an upper portion.

4. The plasma processing apparatus of claim 1, wherein the width of a lower portion of the first embedded member is the same as the width of an upper portion of the second embedded member.

5. The plasma processing apparatus of claim 1, wherein the first embedded member has a first cylindrical portion and a second cylindrical portion having a diameter greater than the diameter of the first cylindrical portion.

6. The plasma processing apparatus of claim 1, wherein the first embedded member has a truncated cone shape.

7. The plasma processing apparatus of claim 1, wherein the second embedded member presses an inner peripheral surface of the second through-hole by a restoring force.

8. The plasma processing apparatus of claim 2, wherein the first embedded member has a lower portion having a width larger than the width of an upper portion.

9. The plasma processing apparatus of claim 2, wherein the width of a lower portion of the first embedded member is the same as the width of an upper portion of the second embedded member.

10. The plasma processing apparatus of claim 3, wherein the width of a lower portion of the first embedded member is the same as the width of an upper portion of the second embedded member.

11. The plasma processing apparatus of claim 2, wherein the first embedded member has a first cylindrical portion and a second cylindrical portion having a diameter greater than the diameter of the first cylindrical portion.

12. The plasma processing apparatus of claim 3, wherein the first embedded member has a first cylindrical portion and a second cylindrical portion having a diameter greater than the diameter of the first cylindrical portion.

13. The plasma processing apparatus of claim 4, wherein the first embedded member has a first cylindrical portion and a second cylindrical portion having a diameter greater than the diameter of the first cylindrical portion.

14. The plasma processing apparatus of claim 2, wherein the first embedded member has a truncated cone shape.

15. The plasma processing apparatus of claim 3, wherein the first embedded member has a truncated cone shape.

16. The plasma processing apparatus of claim 4, wherein the first embedded member has a truncated cone shape.

17. The plasma processing apparatus of claim 2, wherein the second embedded member presses an inner peripheral surface of the second through-hole by a restoring force.

18. The plasma processing apparatus of claim 3, wherein the second embedded member presses an inner peripheral surface of the second through-hole by a restoring force.

19. The plasma processing apparatus of claim 4, wherein the second embedded member presses an inner peripheral surface of the second through-hole by a restoring force.

20. The plasma processing apparatus of claim 5, wherein the second embedded member presses an inner peripheral surface of the second through-hole by a restoring force.

* * * * *